(12) United States Patent
Tatsumi et al.

(10) Patent No.: US 6,646,952 B2
(45) Date of Patent: Nov. 11, 2003

(54) SEMICONDUCTOR CIRCUIT AND SEMICONDUCTOR DEVICE

(75) Inventors: Takashi Tatsumi, Tokyo (JP); Junji Mori, Tokyo (JP); Hiroki Sugano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 55 days.

(21) Appl. No.: 10/122,234

(22) Filed: Apr. 16, 2002

(65) Prior Publication Data

US 2003/0090301 A1 May 15, 2003

(30) Foreign Application Priority Data

Nov. 12, 2001 (JP) ........................................ 2001-346083

(51) Int. Cl.⁷ ............................................... G11C 11/00
(52) U.S. Cl. .................. 365/230.06; 365/226; 365/227; 365/201
(58) Field of Search ...................... 365/230.01, 230.06, 365/226, 227, 201

(56) References Cited

U.S. PATENT DOCUMENTS

| | | | | |
|---|---|---|---|---|
| 5,689,465 | A | * 11/1997 | Sukegawa et al. | .......... 365/200 |
| 6,429,729 | B2 | * 8/2002 | Kobayashi et al. | .......... 327/540 |
| 2001/0050590 | A1 | * 12/2001 | Kobayashi et al. | .......... 327/540 |

FOREIGN PATENT DOCUMENTS

| | | |
|---|---|---|
| JP | 05-304212 | 11/1993 |
| JP | 08-220196 | 8/1996 |

* cited by examiner

Primary Examiner—Viet Q. Nguyen
(74) Attorney, Agent, or Firm—Burns, Doane, Swecker & Mathis, LLP

(57) ABSTRACT

The semiconductor circuit includes a driver that is input with a signal, a driver that is input with a signal, and a driver of which input terminal is connected to output terminals of both the drivers, and of which output terminal is connected to input terminals of both the drivers.

16 Claims, 6 Drawing Sheets

SEMICONDUCTOR CIRCUIT AND SEMICONDUCTOR DEVICE

FIELD OF THE INVENTION

The present invention relates to a semiconductor circuit and a semiconductor device which optimize the driving power and power consumption and which are used for a SiP (System in a Package).

BACKGROUND OF THE INVENTION

FIG. 11 is a partial cross-sectional diagram that shows a structure of a conventional SiP. As shown in FIG. 11, a chip having a logic circuit formed thereon ("logic chip") 2000 is provided on a die pad 3000 with a SiP 1100. A chip having a memory like a DRAM formed thereon ("memory chip") 1000 is mounted on this logic chip 2000.

Each of the memory chip 1000 and the logic chip 2000 is provided with a pad (not shown) that is connected to an input/output circuit formed on each chip. In order to electrically connect between the memory chip 1000 and the logic chip 2000, the pads provided on both chips are connected to each other via a wire 5000b. In order to electrically connect between the SiP 1110 and the outside (not shown), the pad provided on the logic chip 2000 is connected with an inner lead 7000 via a wire 5000a. In other words, input/output signals of the memory chip 1000 are input to/output from the wire 5000a via the logic chip 2000, without being directly input to/output from a package.

When testing the memory chip 1000 and the logic chip 2000 in a wafer status respectively, the input/output signals of the memory chip 1000 and the logic chip 2000 are input to/output from the tested device directly from the respective pads. Therefore, the load becomes large, and it becomes necessary to secure the input/output driving power to bear the test.

When only the memory chip 1000 and the logic chip 2000 are packaged into one like the SiP 1100, surplus driving power which-drives a chip outside exists in each input/output circuit of each chip.

However, during the normal use of the SiP 1100, the load of the wire 5000b between the chips is small. Therefore, only the driving power is required to exist that can drive the load from the memory chip 1000 to the logic chip 2000, or from the logic chip 2000 to the memory chip 1000.

In the above conventional SiP 1100, a chip having an input/output circuit that does not need to drive the package outside is not required to have the driving power which drives the load of the package outside. On the other hand, when this driving power is held, power consumption becomes larger.

When the driving power that is necessary for the testing is secured, this has a problem that the power consumption becomes larger than the driving power that is necessary for the normal use.

SUMMARY OF THE INVENTION

It is an object of the present invention to provide a semiconductor circuit capable of optimizing the driving power and power consumption, by changing the driving power of an input/output circuit at a test time and a normal use time.

The semiconductor circuit according to one aspect of the present invention comprises, The semiconductor circuit comprising a buffer circuit and an input/output circuit. The buffer circuit has a first controller that is input with a first signal that becomes enable at the time of outputting data and becomes disable at the time of inputting data, and a second signal that is changed over in a test mode, and that outputs a third signal, and a second controller that is input with the first signal and an inverted signal of the second signal, and that outputs a fourth signal. The input/output circuit has a first driver that is input with the third signal, a second driver that is input with the fourth signal, and a third driver of which input terminal is connected to output terminals of said first driver and said second driver, and of which output terminal is connected to input terminals of said first driver and said second driver.

The semiconductor circuit according to another aspect of the present invention comprises a buffer circuit and an input/output circuit. The buffer circuit has a first controller that is input with a first signal that becomes enable at the time of outputting data and becomes disable at the time of inputting data, and a second signal that is changed over in a test mode, and that outputs a third signal, and a second controller that is input with the first signal, and that outputs a fourth signal. The input/output circuit has a first driver that is input with the third signal, a second driver that is input with the fourth signal, and a third driver of which input terminal is connected to output terminals of said first driver and said second driver, and of which output terminal is connected to input terminals of said first driver and said second driver.

The semiconductor device according to still another aspect of the present invention comprises the semiconductor circuit according to the present invention.

Other objects and features of this invention will become apparent from the following description with reference to the accompanying drawings.

DETAILED DESCRIPTIONS

Embodiments of the semiconductor circuit and the semiconductor device according to the present invention will be explained in detail below with reference to the accompanying drawings. It should be noted that the present invention is not limited to these embodiments.

Figure 1:
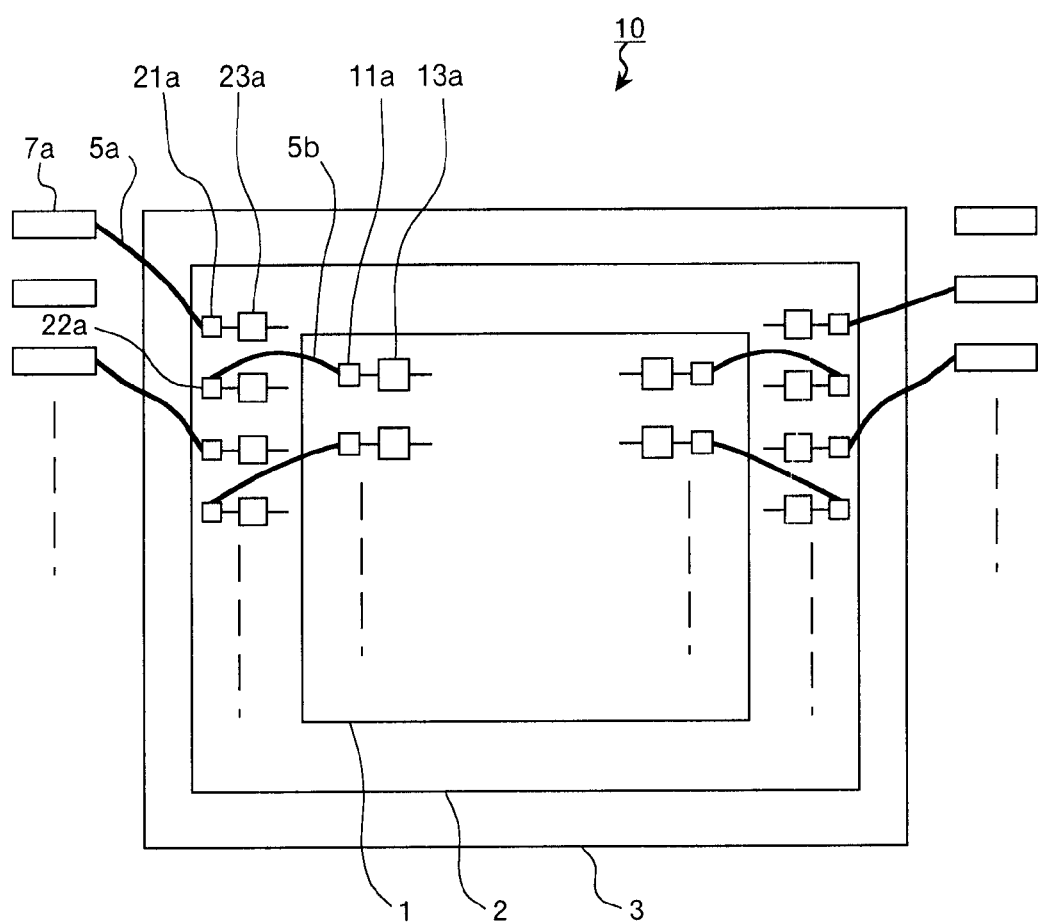
FIG. 1 is a top plan diagram that shows a part of a structure of a SiP according to a first embodiment of this invention.

FIG. 1 is a partial top plan diagram showing a structure of a SiP 10 according to a first embodiment of the invention. As shown in FIG. 1, this SiP 10 has a logic chip 2 provided on a die pad 3. A memory chip 1 is mounted on this logic chip 2. An input/output circuit 13a is formed on this memory chip 1. A pad 11a that is connected to the input/output circuit 13a is also provided on this memory chip 1. It is needless to mention that the pad 11a and the input/output circuit 13a may be provided in plurality.

An input/output circuit 23a is formed on the logic chip 2. A pad 21a that is connected to this input/output circuit 23a is provided on this logic chip 2. It is needless to mention that the pads 21a and the input/output circuits 23a may be provided in plurality. For example, a pad 22a is connected to an another input/output circuit.

In order to electrically connect between the memory chip 1 and the logic chip 2, the pads 11a and 22a provided on the respective chips are connected to each other via a wire 5b. In order to electrically connect between the SiP 10 and the outside (not shown), the pad 21a provided on the logic chip 2 is connected with an inner lead 7 via a wire 5a.

Figure 2:
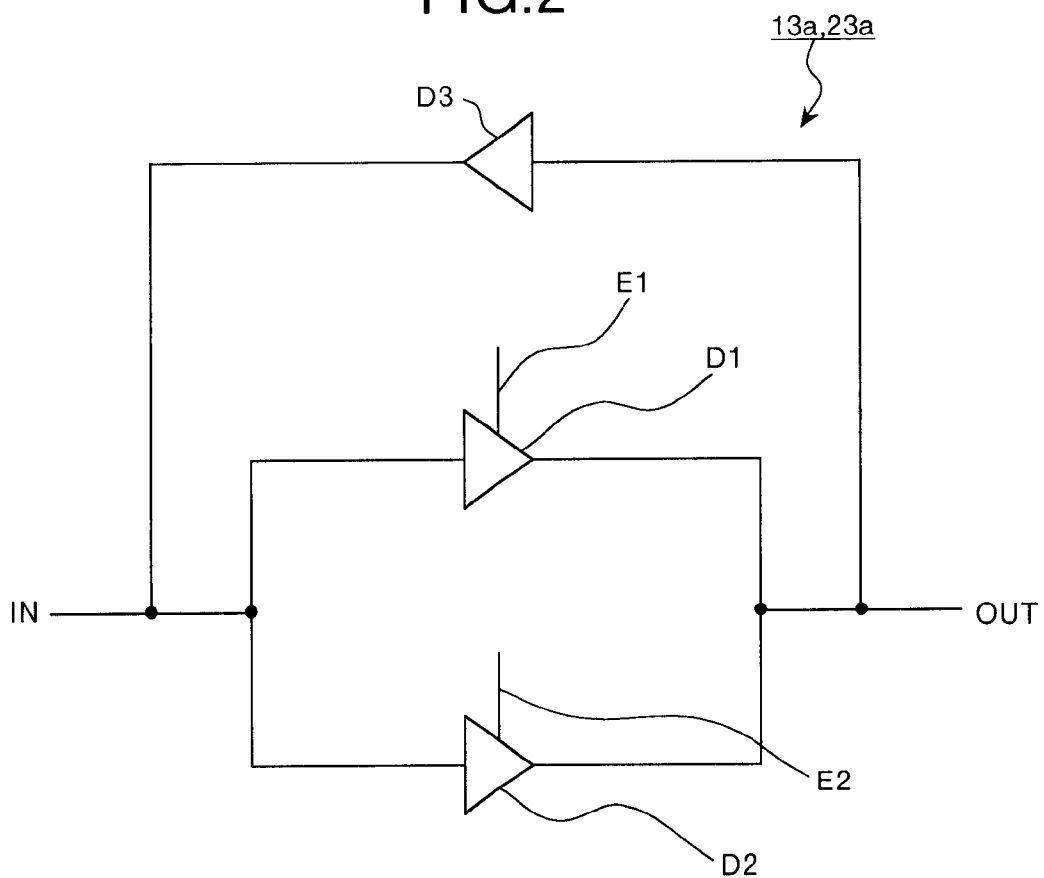
FIG. 2 is an input/output circuit diagram according to the first embodiment of this invention.

FIG. 2 shown a circuit diagram of the input/out circuit according to the first embodiment of this invention. The circuit diagram shown here may be the circuit diagram of the input/output circuit 13a or the input/output circuit 23a. As shown in FIG. 2, the input/output circuit is provided with a driver D1 to which a signal E1 is input, and a driver D2 to which a signal E2 is input.

There is provided a driver D3 of which input terminal is connected to output terminals of the driver D1 and D2 respectively, and of which output terminal is connected to input terminals of the driver D1 and D2 respectively. The driving power of the driver D1 is set larger than that of the driver D2. The driver D1 has a driving power that is sufficient enough to drive a not shown tester. The driver D2 has a driving power that is sufficient enough to drive the input/output circuit, but does not have driving power to drive the tester.

Figure 3:
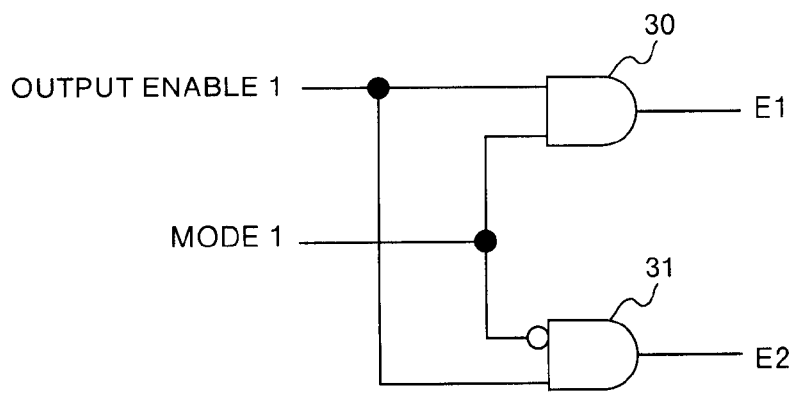
FIG. 3 is a circuit diagram of a buffer circuit according to the first embodiment of this invention.

FIG. 3 is a circuit diagram of a buffer circuit according to the first embodiment. As shown in FIG. 3, the buffer circuit has an AND circuit 30 that is input with an output enable 1 and MODE 1 that are output from not shown internal circuits provided in the memory chip 1 and the logic chip 2 respectively. The output enable 1 is a signal that becomes enable when data is output from each of the input/output circuits 13a and 23a, and that becomes disable when no data is output. The MODE 1 is a signal that is changed over in a test mode. There is also provided an AND circuit 31 that is input with the output enable 1 and an inverted signal of the MODE 1 that are output from the internal circuits provided in the memory chip 1 and the logic chip 2 respectively. It is needless to mention that the circuits provided on the buffer circuit are not limited to the AND circuits 30 and 31, and controllers having similar functions may be provided.

The operation of the circuits shown in FIG. 2 and FIG. 3 will be explained. During the testing, if the MODE 1 is of high logical level ("H level") and the output enable 1 is also of H level, then the AND circuit 30 outputs the signal E1 of the H level, and the AND circuit 31 outputs the signal E2 of low logical level ("L level"). If the MODE 1 is of H level and the output enable 1 is of L level, then the AND circuit 30 outputs the signal E1 of L level and the AND circuit 31 also outputs the signal E2 of L level. When the signal E1 of H level is output, the driver D1 is driven to output signal OUT shown in FIG. 2. In other words, the tester with the driving power of the driver D1.

During the normal usage, if the MODE 1 is of L level and the output enable 1 is of H level, then the AND circuit 30 outputs the signal E1 of L level and the AND circuit 31 outputs the signal E2 of H level. If the MODE 1 is of L level and the output enable 1 is of L level, then the AND circuit 30 outputs the signal E1 of L level, and the AND circuit 31 outputs the signal E2 of L level. When the signal E2 of H level is output, the driver D2 is driven to output the signal OUT shown in FIG. 2. In other words, the input/output circuits 13a and 23a are driven based on the driving of the driver D2, but the tester is not driven.

When signals are input to the input/output circuits 13a and 23a from the outside of the chip, the driver D3 functions to input these signals straight from the input/output circuits 13a and 23a to the inside.

It is explained above that the memory chip 1 is mounted on the logic chip 2. However, it is not limited to this case. The chip 1 can also be mounted on the die pad 3 in parallel.

It is explained above that the two chips are connected by wire bonding. However, it is not limited to this case. The chips can be connected in bump by flip chip bonding.

According to the first embodiment, the level of the MODE 1 is changed over at the testing time and the normal usage time, and the driving of the drivers D1 and D2 of the input/output circuits 13a and 23a is changed over based on this level change. Therefore, it is possible to select optimum driving power during the testing time and during the normal usage time respectively. As a result, it becomes possible to lower the power consumption during the normal usage.

Figure 4:
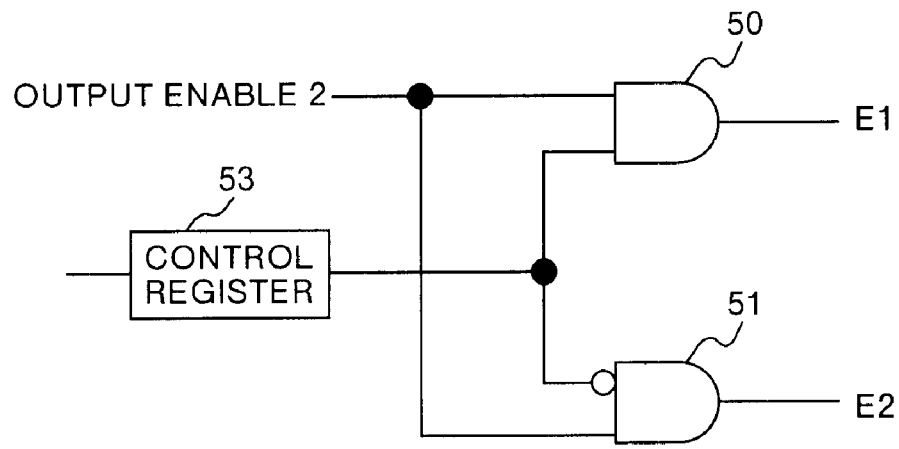
FIG. 4 is a circuit diagram of a buffer circuit according to a second embodiment of this invention.

FIG. 4 is a circuit diagram of a buffer circuit according to a second embodiment. This buffer circuit has a control register 53 that is connected to the internal circuits provided in a memory chip and a logic chip (not shown) similar to those shown in FIG. 1 respectively.

There is provided an AND circuit 50 that is input with an output enable 2 output from the internal circuits, and an output of the control register 53. The AND circuit 50 outputs the signal E1. There is also provided an AND circuit 51 that is input with the output enable 2 and an inverted signal of the output of the control register 53. The AND circuit 51 outputs the signal E2. The signals E1 and E2 are input to drivers of these input/output circuits.

The output enable 2 becomes enable when data is output from input/output circuits similar to that shown in FIG. 2, and that becomes disable when there is no data output.

It is needless to mention that the circuits provided on the buffer circuit are not limited to the AND circuits 50 and 51, and controllers having similar functions may be provided.

The operation of the input/output circuits and the buffer circuit shown in FIG. 4 will be explained. During the testing, if the output from the control register 53 is of H level and the output enable 2 is of H level, then the AND circuit 50 outputs the signal E1 of H level and the AND circuit 51 outputs the signal E2 of L level. If the output from the control register 53 is of H level and the output enable 2 is of L level, then the AND circuit 50 outputs the signal E1 of L level and the AND circuit 51 outputs the signal E2 of L level. When the signal E1 of H level is output, the driver D1 is driven to output the signal OUT shown in FIG. 2. In other words, the tester with the driving power of the driver D1.

During the normal usage, if the output from the control register 53 is of L level and the output enable 2 is of H level, then the AND circuit 50 outputs the signal E1 of L level and the AND circuit 51 outputs the signal E2 of H level. If the output of the control register 53 is of L level and the output enable 2 is of L level, then the AND circuit 50 outputs the signal E1 of L level, and the AND circuit 51 outputs the signal E2 of L level. When the signal E2 of H level is output, the driver D2 is driven to output OUT in the above input/output circuits. In other words, the input/output circuits are driven based on the driving of the driver D2, but the tester is not driven.

It is explained above that the two chips are connected by wire bonding. However, it is not limited to this case. The chips can be connected in bump by flip chip bonding.

According to the second embodiment, the level of the control register 53 is changed over at the testing time and the normal usage time, and the driving of the drivers D1 and D2 of the input/output circuits is changed over based on this level change. Therefore, it is possible to select optimum driving power during the testing time and during the normal usage time respectively. As a result, it becomes possible to lower the power consumption during the normal usage.

Figure 5:
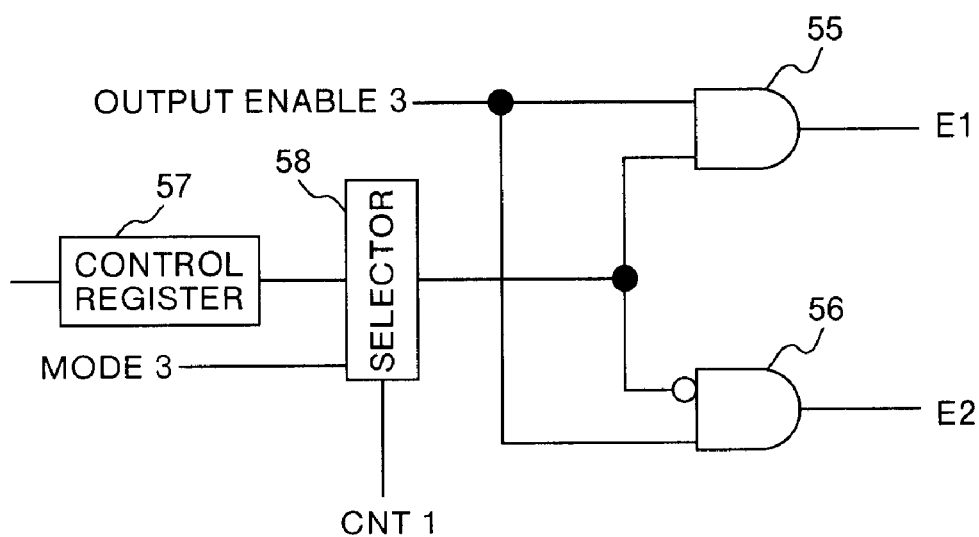
FIG. 5 is a circuit diagram of a buffer circuit according to a third embodiment of this invention.

FIG. 5 is a circuit diagram of a buffer circuit according to a third embodiment. This buffer circuit has a control register 57 that is connected to internal circuits (not shown) provided in a memory chip and a logic chip (not shown) similar to those shown in FIG. 1 respectively.

There is provided a selector 58 that is input with a signal output from the control register 57, and MODE 3 and CNT 1 that are output from the internal circuits. There is provided an AND circuit 55 that is input with an output enable 3 output from the internal circuits, and a signal output from the selector 58. The AND circuit 55 outputs the signal E1. There is also provided an AND circuit 56 that is input with the output enable 3 and an inverted signal of the output from the selector 58. The AND circuit 55 outputs the signal E2. The signals E1 and E2 are input to drivers of the input/output circuits.

The output enable 3 becomes enable when data is output from input/output circuits similar to that shown in FIG. 2, and that becomes disable when there is no data output. The MODE 3 is a signal that is changed over in the test mode.

The MODE 3 and the output of the control register 57 are selectively output based on the logical level of CNT 1. For example, the MODE 3 is selected if the CNT 1 is of H level, and the control register 57 is selected if the CNT 1 is of L level. It will be assumed here that the CNT 1 is of H level. In other words, that the MODE 3 is selected.

It is needless to mention that the circuits provided on the buffer circuit are not limited to the AND circuits 55 and 56, and controllers having similar functions may be provided.

The operation of the buffer circuit shown in FIG. 5 and the input/output circuit will be explained. During the testing, if the MODE 3 is of H level and the output enable 3 is of H level, then the AND circuit 55 outputs the signal E1 of H level and the AND circuit 56 outputs the signal E2 of L level. If the MODE 3 is of H level and the output enable 3 is of L level, then the AND circuit 55 outputs the signal E1 of L level and the AND circuit 56 outputs the signal E2 of L level. When the signal E1 of H level is output, the driver D1 is driven to output OUT in the above input/output circuits. In other words, the tester with the driving power of the driver D1.

During the normal usage, if the MODE 3 is of L level and the output enable 3 is of H level, then the AND circuit 55 outputs the signal E1 of L level and the AND circuit 56 outputs the signal E2 of H level. If the MODE 3 is of L level and the output enable 2 is of L level, then the AND circuit 55 outputs the signal E1 of L level and the AND circuit 56 outputs the signal E2 of L level. When the signal E2 of H level is output, the driver D2 is driven to output the signal OUT shown in FIG. 2. In other words, the input/output circuits are driven based on the driving of the driver D2, but the tester is not driven.

It is explained above that the two chips are connected by wire bonding. However, it is not limited to this case. The chips can be connected in bump by flip chip bonding.

According to the third embodiment, the level of the MODE 3 is changed over at the testing time and the normal usage time, and the driving of the drivers D1 and D2 of the input/output circuits is changed over based on this level change. Therefore, it is possible to select optimum driving power during the testing time and during the normal usage time respectively. As a result, it becomes possible to lower the power consumption during the normal usage.

Figure 6:
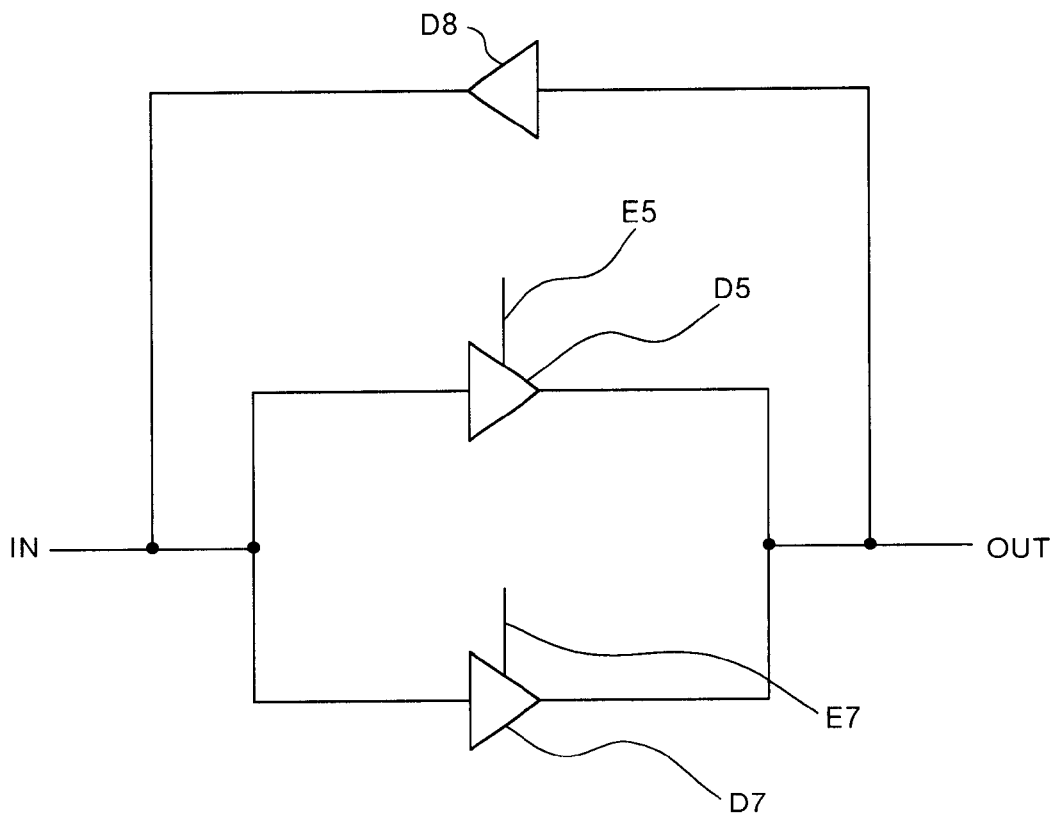
FIG. 6 is an input/output circuit diagram according to a fourth embodiment of this invention.

FIG. 6 is a circuit diagram of an input/out circuit according to a fourth embodiment of this invention. This input/output circuit is used for a memory chip and a logic chip (not shown) similar to those shown in FIG. 1. This input/output circuit is provided with a driver D5 to which a signal E5 is input, and a driver D7 to which a signal E7 is input. There is also provided a driver D8 of which input terminal is connected to output terminals of the drivers D5 and D7 respectively, and of which output terminal is connected to input terminals of the drivers D5 and D7 respectively.

The driving power of the driver D5 is set larger than that of the driver D7. The driving power of the sum of the driver D5 and the driver D7 is set such that it is sufficient enough to drive a tester (not shown). The driver D7 has driving power that is sufficient enough to drive the input/output circuit, but does not have driving power to drive the tester.

Figure 7:
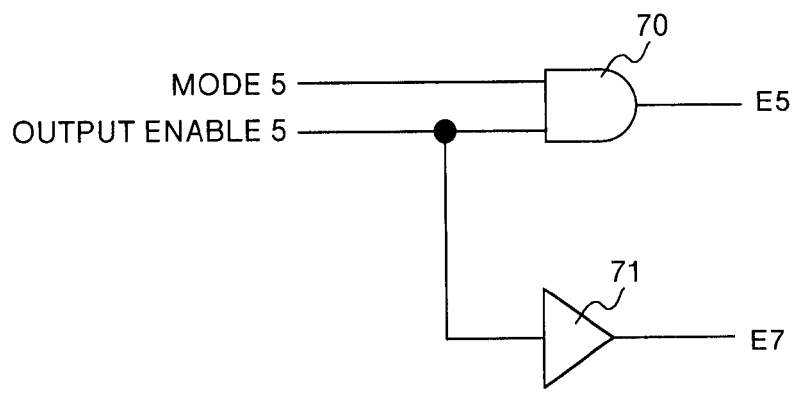
FIG. 7 is a circuit diagram of a buffer circuit according to the fourth embodiment of this invention.

FIG. 7 is a circuit diagram of a buffer circuit according to the fourth embodiment. This buffer circuit has an AND circuit 70 that is input with an output enable 5 and MODE 5 that are output from internal circuits (not shown) provided in the memory chip and the logic chip similar to those shown in FIG. 1 respectively. The AND circuit 70 outputs a signal E5. There is also provided an inverter circuit 71 that is input with the output enable 5. The inverter circuit 71 outputs a signal E7.

The output enable 5 signal is such that it becomes enable when data is output from the input/output circuit, and becomes disable when no data is output. The MODE 5 is a signal that is changed over in a test mode.

It is needless to mention that the circuits provided on the buffer circuit are not limited to the AND circuit 70 and the inverter circuit 71, and controllers having similar functions may be provided.

The operation of the circuits shown in FIG. 6 and FIG. 7 will be explained. During the testing, if the MODE 5 is of H level and the output enable 5 is of H level, then the AND circuit 700 outputs the signal E5 of H level and the inverter circuit 71 outputs the signal E7 of L level. If the MODE 5 is of H level and the output enable 5 is of L level, then the AND circuit 70 outputs the signal E5 of L level and the inverter circuit 71 outputs the signal E7 of H level. When the signals E5 and E7 of H level are output, a driving power equal to the sum of the driving powers of the drivers D5 and D7 is output. In other words, the tester is driven with a driving power that is equal to the sum of the driving powers of the drivers D5 and D7.

During the normal usage, if the MODE 5 is of L level and the output enable 5 is of H level, then the AND circuit 70 outputs the signal E5 of L level and the inverter circuit 71 outputs the signal E7 of L level. If the MODE 5 is of L level and the output enable 5 is of L level, then the AND circuit 70 outputs the signal E5 of L level and the inverter circuit 71 outputs the signal E7 of H level. When the signal E7 of H level is output, the driver D7 is driven to output the signal OUT shown in FIG. 6. In other words, the input/output circuit is driven with the driving power of the driver D7, but the tester is not driven.

When a signal is input to the input/output circuit from the outside of the chip, the driver D8 functions to input this signal straight from the input/output circuit to the inside.

It is explained above that the two chips are connected by wire bonding. However, it is not limited to this case. The chips can be connected in bump by flip chip bonding.

According to the fourth embodiment, the level of the MODE 5 is changed over at the testing time and the normal usage time, and the driving of the drivers D5 and D7 of the input/output circuit is changed over based on this level change. Therefore, it is possible to select optimum-driving power during the testing time and during the normal usage time respectively. As a result, it becomes possible to lower the power consumption during the normal usage.

Figure 8:
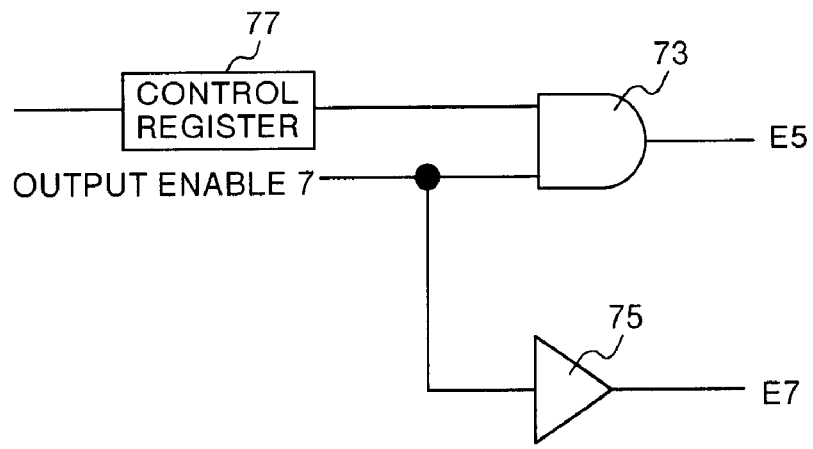
FIG. 8 is a circuit diagram of a buffer circuit according to a fifth embodiment of this invention.

FIG. 8 is a circuit diagram according to a fifth embodiment of this invention. This buffer circuit is provided with a control register 77 that is connected to internal circuits (not shown) provided in a memory chip and a logic chip (not shown) similar to those shown in FIG. 1.

There is also provided an AND circuit 73 that is input with an output enable 7 output from the internal circuits and a signal output from the control register 77. The AND circuit 73 outputs the signal E5. In addition, there is provided an inverter circuit 75 that is input with the output enable 7. The inverter circuit 75 outputs the signal E7. The signals E5 and E7 are input to drivers of the input/output circuit.

The output enable 7 is such that it that becomes enable when data is output from an input/output circuit similar to that shown in FIG. 6, and it becomes disable when no data is output.

It is needless to mention that the circuits provided on the buffer circuit are not limited to the AND circuit 73 and the inverter circuit 75, and controllers having similar functions may be provided.

The operation of the buffer circuit shown in FIG. 8 and the input/output circuit will be explained. During the testing, if the output from the control register 77 is of H level and the output enable 7 is of H level, then the AND circuit 73 outputs the signal E5 of H level and the inverter circuit 75 outputs the signal E7 of L level. If the output from the control register 77 is of H level and the output enable 7 is of L level, then the AND circuit 73 outputs the signal E5 of L level and the inverter circuit 75 outputs the signal E7 of H level. When the signals E5 and E7 of H level are output, a driving power equal to the sum of the driving powers of the drivers D5 and a driver D7 is output. In other words, the tester is driven with a driving power that is equal to the sum of the driving powers of the drivers D5 and D7.

During the normal usage, if the output from the control register 77 is of L level and the output enable 7 is of H level, then the AND circuit 73 outputs the signal E5 of L level and the inverter circuit 75 outputs the signal E7 of L level. If the output from the control register 77 is of L level and the output enable 7 is of L level, then the AND circuit 73 outputs the signal E5 of L level and the inverter circuit 75 outputs the signal E7 of H level. When the signal E7 of H level is output, the driver D7 is driven to output the signal OUT shown in FIG. 6. In other words, the input/output circuit is driven with the driving power of the driver D7.

It is explained above that the two chips are connected by wire bonding. However, it is not limited to this case. The chips can be connected in bump by flip chip bonding.

According to the fifth embodiment, the level of the output enable 7 is changed over at the testing time and the normal usage time, and the driving of the drivers D3 and D7 of the input/output circuit is changed over based on this level change. Therefore, it is possible to select optimum driving power during the testing time and during the normal usage time respectively. As a result, it becomes possible to lower the power consumption during the normal usage.

Figure 9:
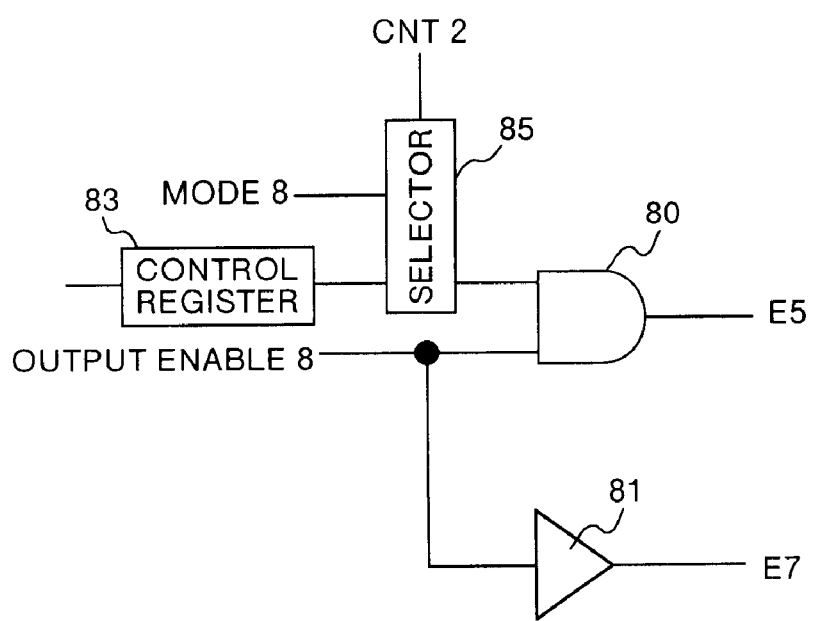
FIG. 9 is a circuit diagram of a buffer circuit according to a sixth embodiment of this invention.

FIG. 9 is a circuit diagram of a buffer circuit according to a sixth embodiment of this invention. This buffer circuit is provided with a control register 83 that is connected to internal circuits (not shown) provided in a memory chip and a logic chip (not shown) similar to those shown in FIG. 1.

There is provided a selector 85 that is input with an output of the control register 83, and MODE 8 and CNT 2 that are output from the internal circuits. There is also provided an AND circuit 80 that is input with an output enable 8 output from the internal circuits and a signal output from the selector 85. The AND circuit 80 outputs the signal E5. In addition, there is provided an inverter circuit 81 that is input with the output enable 8. The inverter circuit 81 outputs the signal E7. The signals E5 and E7 are input to drivers of the input/output circuit.

The output enable 8 is such that it that becomes enable when data is output from an input/output circuit similar to that shown in FIG. 6, and it becomes disable when no data is output. The MODE 8 is a signal that is changed over in a test mode. The MODE 8 and the output of the control register 83 are selectively output based on a logical level of CNT 2. For example, the MODE 8 is selected when the CNT 2 is of H level, and the control register 83 is selected when the CNT 2 is of L level. It is assumed here that the CNT 2 is of H level. In other words, that the MODE 8 is selected.

It is needless to mention that the circuits provided on the buffer circuit are not limited to the AND circuit 80 and the inverter circuit 81, and controllers having similar functions may be provided.

The operation of the buffer circuit shown in FIG. 9 and the input/output circuit will be explained. During the testing, if the MODE 8 is of H level and the output enable 8 is of H level, then the AND circuit 80 outputs the signal E5 of H level and the inverter circuit 81 outputs the signal E7 of L level. If the MODE 8 is of H level and the output enable 8 is of L level, then the AND circuit 80 outputs the signal E5 of L level and the inverter circuit 81 outputs the signal E7 of H level. When the signals E5 and E7 of H level are output, a driving power equal to the sum of the driving powers of the drivers D5 and D7 is output. In other words, the tester is driven with a driving power that is equal to the sum of the driving powers of the drivers D5 and D7.

During the normal usage, if the MODE 8 is of L level and the output enable 8 is of H level, then the AND circuit 80 outputs the signal E5 of L level and the inverter circuit 81 outputs the signal E7 of L level. If the MODE 8 is of L level and the output enable 8 is of L level, then the AND circuit 80 outputs the signal E5 of L level and the inverter circuit 81 outputs the signal E7 of H level. When the signal E7 of H level is output, the driver D7 is driven to output the signal OUT shown in FIG. 6. In other words, the input/output circuit is driven with the driving power of the driver D7, but the tester is not driven.

It is explained above that the two chips are connected by wire bonding. However, it is not limited to this case. The chips can be connected in bump by flip chip bonding.

According to the sixth embodiment, the level of the MODE 8 is changed over at the testing time and the normal usage time, and the driving of the drivers D3 and D7 of the input/output circuit is changed over based on this level change. Therefore, it is possible to select optimum-driving power during the testing time and during the normal usage time respectively. As a result, it becomes possible to lower the power consumption during the normal usage.

Figure 10:
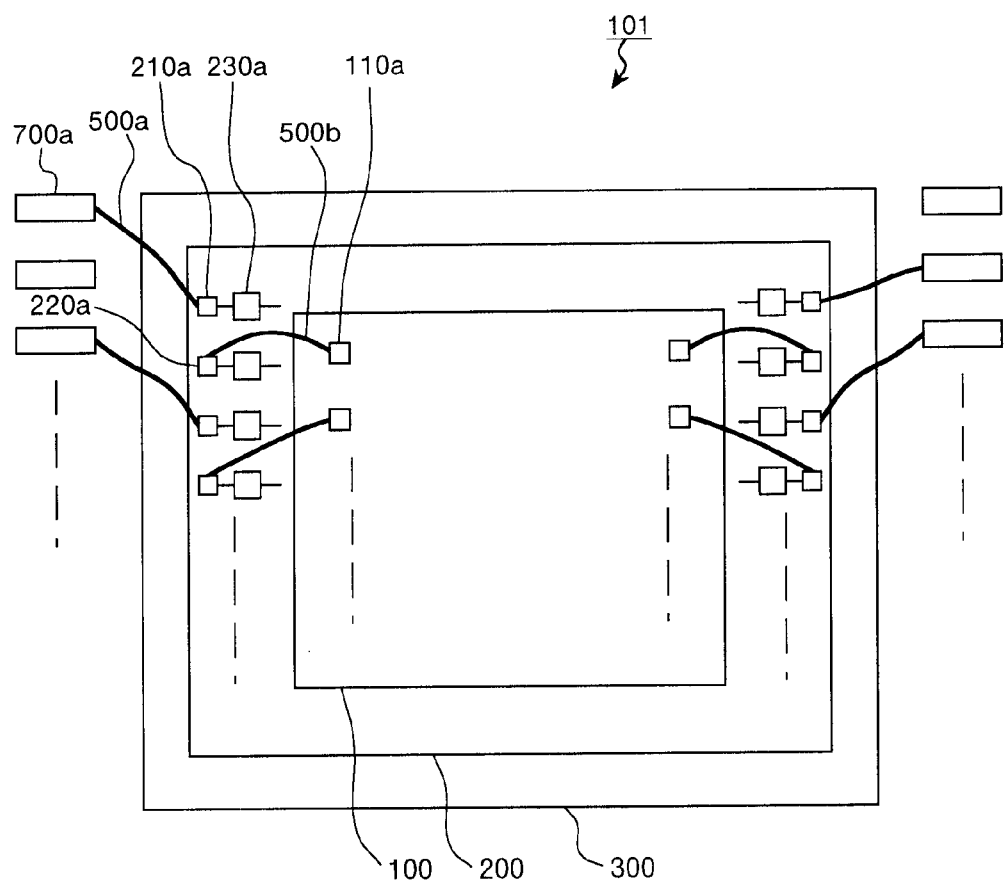
FIG. 10 is a top plan diagram that shows a part of a structure of a SiP according to a seventh embodiment of this invention.
Figure 11:
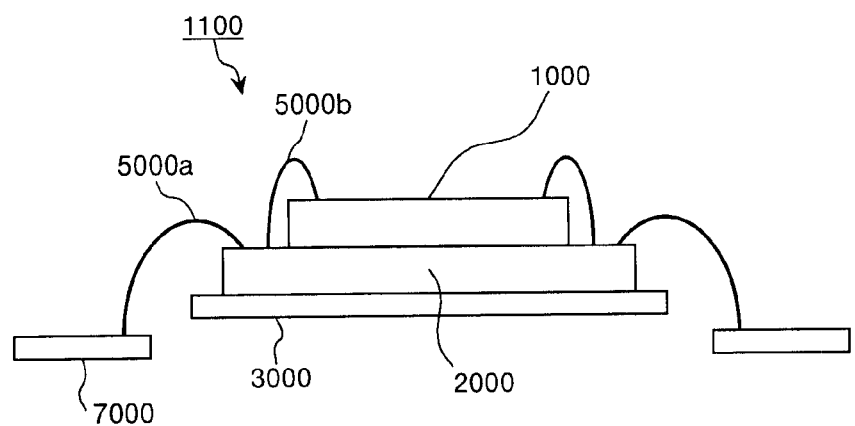
FIG. 11 is a partial cross-sectional diagram that shows a structure of a conventional Sip.

FIG. 10 is a partial top plan diagram showing a structure of a SiP according to a seventh embodiment of the invention. As shown in FIG. 10, this SiP 101 has a logic chip 200 provided on a die pad 300. A memory chip 100 is mounted on this logic chip 200. The conventional chip having a pad 110a is used for the memory chip 100. It is needless to mention that the pad 110a may be provided in plurality on the memory chip 100.

An input/output circuit 230a is formed on the logic chip 200. A pad 210a that is connected to this input/output circuit 230a is provided on this logic chip 200. It is needless to mention that the pads 210a and the input/output circuits 230a may be provided in plurality. For example, a pad 220a is connected to an another input/output circuit.

In order to electrically connect between the memory chip 100 and the logic chip 200, the pads 110a and 220a provided on the respective chips are connected to each other via a wire 500b. In order to electrically connect between the SiP 101 and the outside (not shown), the pad 210a provided on the logic chip 200 is connected with an inner lead 700 via a wire 500a.

The input/output circuit 230a may have a structure similar to that shown in FIG. 2 or FIG. 6.

While the memory chip 100 is mounted on the logic chip 200 in the present embodiment, it is needless to mention that the chip 100 can also be mounted on the die pad 300 in parallel.

It is explained above that the two chips are connected by wire bonding. However, it is not limited to this case. The chips can be connected in bump by flip chip bonding.

According to the seventh embodiment, it is possible to use a conventional memory chip. Therefore, it is possible to select optimum driving power during the testing time and during the normal usage time, by only changing over the drive of the drivers of the input/output circuit provided on the logic chip. As a result, it becomes possible to lower the power consumption during the normal usage.

In an eighth embodiment, it is possible to structure a SiP (not shown) by using a logic chip in place of the memory chip mentioned in the first to the seventh embodiments. In other words, the SiP can be structured using only the logic chip, without being limited to a memory chip. It is needless to mention that logic chips can be mounted in parallel on the die pad. It is needless to mention that the chips need not be connecting using wire bonding. The chips can be connected in bump by flip chip bonding.

According to the eighth embodiment, as the SiP is structured using only logic chips, the system has a large variation. Therefore, it is possible to select optimum driving power during the testing time and during the normal usage time, by only changing over the drive of drivers of the input/output circuit provided on the logic chip. As a result, it becomes possible to lower the power consumption during the normal usage.

In a ninth embodiment, it is possible to structure a SiP (not shown) by using a plurality of chips provided with the buffer circuit and the input/output circuit shown in the first to the seventh embodiments. In other words, the SiP can be structured using chips provided with the buffer circuit and the input/output circuit, for example, analog chips, without being limited to a memory chip and a logic chip. It is needless to mention that a plurality of chips can be mounted in parallel on the die pad. It is needless to mention that the chips need not be connecting using wire bonding. The chips can be connected in bump by flip chip bonding.

According to the ninth embodiment, the system has a larger variation. Therefore, it is possible to select optimum driving power during the testing time and during the normal usage time, by only changing over the drive of drivers of the input/output circuit provided on the chips. As a result, it becomes possible to lower the power consumption during the normal usage.

As explained above, according to the semiconductor circuit of one aspect of the present invention, the level of the MODE 1 is changed over at the testing time and the normal usage time, and the driving of the drivers D1 and D2 of the input/output circuits 13a and 23a is changed over based on this level change. Therefore, it is possible to select optimum driving power during the testing time and during the normal usage time respectively. As a result, it becomes possible to lower the power consumption during the normal usage.

Moreover, the level of the control register is changed over at the testing time and the normal usage time, and the driving of the drivers D1 and D2 of the input/output circuits is changed over based on this level change. Therefore, it is possible to select optimum driving power during the testing time and during the normal usage time respectively. As a result, it becomes possible to lower the power consumption during the normal usage.

Furthermore, the level of the MODE 3 is changed over at the testing time and the normal usage time, and the driving of the drivers D1 and D2 of the input/output circuits is changed over based on this level change. Therefore, it is possible to select optimum driving power during the testing time and during the normal usage time respectively. As a result, it becomes possible to lower the power consumption during the normal usage.

Moreover, the access speed becomes faster. Therefore, it is possible to select optimum driving power during the testing time and during the normal usage time respectively. As a result, it becomes possible to lower the power consumption during the normal usage.

According to the semiconductor circuit of another aspect of the present invention, the level of the MODE 5 is changed over at the testing time and the normal usage time, and the driving of the drivers D3 and D7 of the input/output circuit is changed over based on this level change. Therefore, it is possible to select optimum-driving power during the testing time and during the normal usage time respectively. As a result, it becomes possible to lower the power consumption during the normal usage.

Moreover, the level of the output enable is changed over at the testing time and the normal usage time, and the driving of the drivers D3 and D7 of the input/output circuit is changed over based on this level change. Therefore, it is possible to select optimum driving power during the testing time and during the normal usage time respectively. As a result, it becomes possible to lower the power consumption during the normal usage.

Furthermore, the level of the MODE is changed over at the testing time and the normal usage time, and the driving of the drivers D3 and D7 of the input/output circuit is changed over based on this level change. Therefore, it is possible to select optimum driving power during the testing time and during the normal usage time respectively. As a result, it becomes possible to lower the power consumption during the normal usage.

Moreover, the access speed becomes faster. Therefore, it is possible to select optimum driving power during the testing time and during the normal usage time respectively. As a result, it becomes possible to lower the power consumption during the normal usage.

According to the semiconductor device of still another aspect of the present invention, it becomes possible to lower the power consumption during the normal usage.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor circuit comprising a buffer circuit and an input/output circuit,
    said buffer circuit having
        a first controller that is input with a first signal that becomes enable at the time of outputting data and becomes disable at the time of inputting data, and a second signal that is changed over in a test mode, and that outputs a third signal; and
        a second controller that is input with the first signal and an inverted signal of the second signal, and that outputs a fourth signal, and
    said input/output circuit having
        a first driver that is input with the third signal;
        a second driver that is input with the fourth signal; and
        a third driver of which input terminal is connected to output terminals of said first driver and said second driver, and of which output terminal is connected to input terminals of said first driver and said second driver.

2. The semiconductor circuit according to claim 1, wherein said buffer circuit comprises:
    a control register that is connected to an internal circuit;
    a first controller that is input with the first signal that becomes enable at the time of outputting data and becomes disable at the time of inputting data, and an output of said control register, and that outputs the third signal; and
    a second controller that is input with the first signal and an inverted signal of the output of said control register, and that outputs the fourth signal.

3. The semiconductor circuit according to claim 1, wherein said buffer circuit comprises:
    a control register that is connected to an internal circuit;
    a selector that is input with the second signal that is changed over in a test mode, an output of said control register, and a fifth signal that is output from said internal circuit;
    a first controller that is input with a first signal that becomes enable at the time of outputting data and becomes disable at the time of inputting data, and an output of said selector, and that outputs the third signal; and
    a second controller that is input with the first signal and an inverted signal of the output of said selector, and that outputs the fourth signal.

4. The semiconductor circuit according to claim 1, wherein said first controller and said second controller are AND circuits.

5. A semiconductor circuit comprising a buffer circuit and an input/output circuit,
    said buffer circuit having
        a first controller that is input with a first signal that becomes enable at the time of outputting data and becomes disable at the time of inputting data, and a second signal that is changed over in a test mode, and that outputs a third signal; and
        a second controller that is input with the first signal, and that outputs a fourth signal, and
    said input/output circuit having
        a first driver that is input with the third signal;
        a second driver that is input with the fourth signal; and
        a third driver of which input terminal is connected to output terminals of said first driver and said second driver, and of which output terminal is connected to input terminals of said first driver and said second driver.

6. The semiconductor circuit according to claim 5, wherein said buffer circuit comprises:
    a control register that is connected to an internal circuit;
    a first controller that is input with the first signal that becomes enable at the time of outputting data and becomes disable at the time of inputting data, and an output of said control register, and that outputs the third signal; and
    a second controller that is input with the first signal, and that outputs the fourth signal.

7. The semiconductor circuit according to claim 5, wherein said buffer circuit comprises:
    a control register that is connected to an internal circuit;
    a selector that is input with the second signal that is changed over in a test mode, an output of said control register, and a fifth signal that is output from said internal circuit;
    a first controller that is input with the first signal that becomes enable at the time of outputting data and becomes disable at the time of inputting data, and the output of said selector, and that outputs the third signal; and
    a second controller that is input with the first signal, and that outputs the fourth signal.

8. The semiconductor circuit according to claim 5, wherein said first controller is an AND circuit, and said second controller is an inverter circuit.

9. A semiconductor device comprising:
    a semiconductor circuit formed with a logic circuit and a semiconductor circuit formed with a memory electrically connected to each other, wherein one or both of said semiconductor circuits having a buffer circuit and an input/output circuit,
    said buffer circuit having
        a first controller that is input with a first signal that becomes enable at the time of outputting data and becomes disable at the time of inputting data, and a second signal that is changed over in a test mode, and that outputs a third signal; and
        a second controller that is input with the first signal and an inverted signal of the second signal, and that outputs a fourth signal, and
    said input/output circuit having
        a first driver that is input with the third signal;

a second driver that is input with the fourth signal; and a third driver of which input terminal is connected to output terminals of said first driver and said second driver, and of which output terminal is connected to input terminals of said first driver and said second driver.

10. The semiconductor device according to claim 9, wherein said semiconductor circuit formed with the memory is mounted on said semiconductor circuit formed with the logic circuit, thereby to achieve electrical connection between said semiconductor circuits.

11. The semiconductor device according to claim 9, wherein said semiconductor circuit that is formed with a memory is replaced with another semiconductor circuit formed with a logic circuit.

12. A semiconductor device comprising:

a semiconductor circuit formed with a logic circuit and a semiconductor circuit formed with a memory electrically connected to each other, wherein one or both of said semiconductor circuits having a buffer circuit and an input/output circuit, said buffer circuit having a first controller that is input with a first signal that becomes enable at the time of outputting data and becomes disable at the time of inputting data, and a second signal that is changed over in a test mode, and that outputs a third signal; and a second controller that is input with the first signal, and that outputs a fourth signal, and said input/output circuit having a first driver that is input with the third signal;

a second driver that is input with the fourth signal; and a third driver of which input terminal is connected to output terminals of said first driver and said second driver, and of which output terminal is connected to input terminals of said first driver and said second driver.

13. The semiconductor device according to claim 12, wherein said semiconductor circuit formed with the memory is mounted on said semiconductor circuit formed with the logic circuit, thereby to achieve electrical connection between said semiconductor circuits.

14. The semiconductor device according to claim 12, wherein said semiconductor circuit that is formed with a memory is replaced with another semiconductor circuit formed with a logic circuit.

15. A semiconductor device comprising a plurality of semiconductor circuits electrically connected to each other, wherein each one of said semiconductor circuits having a buffer circuit and an input/output circuit, said buffer circuit having a first controller that is input with a first signal that becomes enable at the time of outputting data and becomes disable at the time of inputting data, and a second signal that is changed over in a test mode, and that outputs a third signal; and a second controller that is input with the first signal and an inverted signal of the second signal, and that outputs a fourth signal, and said input/output circuit having a first driver that is input with the third signal;

a second driver that is input with the fourth signal; and a third driver of which input terminal is connected to output terminals of said first driver and said second driver, and of which output terminal is connected to input terminals of said first driver and said second driver.

16. A semiconductor device comprising a plurality of semiconductor circuits electrically connected to each other, wherein each one of said semiconductor circuits having a buffer circuit and an input/output circuit, said buffer circuit having a first controller that is input with a first signal that becomes enable at the time of outputting data and becomes disable at the time of inputting data, and a second signal that is changed over in a test mode, and that outputs a third signal; and a second controller that is input with the first signal, and that outputs a fourth signal, and said input/output circuit having a first driver that is input with the third signal;

a second driver that is input with the fourth signal; and a third driver of which input terminal is connected to output terminals of said first driver and said second driver, and of which output terminal is connected to input terminals of said first driver and said second driver.

* * * * *